US012288672B2

(12) United States Patent
Liang et al.

(10) Patent No.: US 12,288,672 B2
(45) Date of Patent: Apr. 29, 2025

(54) METHODS AND APPARATUS FOR CARBON COMPOUND FILM DEPOSITION (71) Applicant: APPLIED MATERIALS, INC., Santa Clara, CA (US)

(72) Inventors: Qiwei Liang, Fremont, CA (US); Srinivas D. Nemani, Sunnyvale, CA (US); Chentsau Chris Ying, Cupertino, CA (US); Ellie Y. Yieh, San Jose, CA (US); Erica Chen, Sunnyvale, CA (US); Nithin Thomas Alex, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 258 days.

(21) Appl. No.: 17/079,783

(22) Filed: Oct. 26, 2020

(65) Prior Publication Data

US 2021/0217585 A1 Jul. 15, 2021

Related U.S. Application Data (60) Provisional application No. 62/961,363, filed on Jan. 15, 2020.

(51) Int. Cl.
*H01J 37/32* (2006.01)
*C23C 16/513* (2006.01)
*H01L 21/02* (2006.01)

(52) U.S. Cl.
CPC .......... *H01J 37/321* (2013.01); *C23C 16/513* (2013.01); *H01L 21/0228* (2013.01); *H01J 2237/3321* (2013.01)

(58) Field of Classification Search
CPC ............... H01J 37/321; C23C 16/46
See application file for complete search history.

(56) References Cited

U.S. PATENT DOCUMENTS 6,323,119 B1  11/2001  Xi et al.
2001/0054385 A1* 12/2001 Horiguchi ........... C23C 16/4586
118/723 R (Continued)

FOREIGN PATENT DOCUMENTS

CN  1563480 A  1/2005
JP  H11149997 A  6/1999

(Continued)

OTHER PUBLICATIONS

International Search Report and Written Opinion for PCT/US2020/064768 dated Mar. 25, 2021.
European Search Report for EP 20 91 4560 dated Dec. 6, 2023.

*Primary Examiner* — Joseph A Miller, Jr.
(74) *Attorney, Agent, or Firm* — Moser Taboada (57) ABSTRACT A method and apparatus for depositing a carbon compound on a substrate includes using an inductively coupled plasma (ICP) chamber with a chamber body, a lid, an interior volume, a pumping apparatus, and a gas delivery system and a pedestal for supporting a substrate disposed within the interior volume of the ICP chamber, the pedestal has an upper portion formed from aluminum nitride with an upper surface that is configured to support and heat a substrate with embedded heating elements and a lower portion with a tube-like structure formed from aluminum nitride that is configured to support the upper portion and house electrodes for supplying power to the embedded heating elements of the upper portion, and the pedestal is configured to heat the substrate during deposition of a carbon compound film.

20 Claims, 4 Drawing Sheets

(56) References Cited

U.S. PATENT DOCUMENTS

| | | |
|---|---|---|
| 2002/0129475 A1 | 9/2002 | Tsai et al. |
| 2003/0080109 A1 | 5/2003 | Choi et al. |
| 2003/0101938 A1* | 6/2003 | Ronsse ............... C23C 16/4401 |
| | | 118/712 |
| 2006/0024451 A1* | 2/2006 | Mungkekar ........... H01J 37/321 |
| | | 118/719 |
| 2006/0191478 A1 | 8/2006 | Gondhalekar et al. |
| 2007/0037397 A1* | 2/2007 | Lu ......................... H01J 37/321 |
| | | 438/710 |
| 2007/0277734 A1 | 12/2007 | Lubomirsky et al. |
| 2008/0029484 A1* | 2/2008 | Park .................. H01J 37/32935 |
| | | 700/121 |
| 2008/0066682 A1* | 3/2008 | Yamashita ........ H01L 21/67103 |
| | | 118/723 VE |
| 2009/0233430 A1* | 9/2009 | Hirano ............... H01J 37/3408 |
| | | 118/723 R |
| 2010/0025384 A1 | 2/2010 | Todorow et al. |
| 2011/0005684 A1 | 1/2011 | Hayami et al. |
| 2012/0067845 A1 | 3/2012 | Monden et al. |
| 2012/0286234 A1* | 11/2012 | Yager ....................... C23C 16/26 |
| | | 257/E21.09 |
| 2013/0012033 A1 | 1/2013 | Kabe et al. |
| 2013/0022811 A1* | 1/2013 | Ahn ..................... C23C 16/0272 |
| | | 977/734 |
| 2013/0288485 A1 | 10/2013 | Liang et al. |
| 2016/0049291 A1* | 2/2016 | Kim .................. C23C 16/45536 |
| | | 438/478 |
| 2016/0099155 A1* | 4/2016 | Park ................. H01L 21/02266 |
| | | 427/249.1 |
| 2017/0198395 A1 | 7/2017 | Nozawa |
| 2018/0174880 A1 | 6/2018 | Swaminathan et al. |
| 2021/0026141 A1 | 1/2021 | Hayashi |
| 2021/0047186 A1 | 2/2021 | Ifuku et al. |

FOREIGN PATENT DOCUMENTS

| | | |
|---|---|---|
| JP | 3837365 B2 | 1/2004 |
| JP | 2009170822 A | 7/2009 |
| JP | 2010-024476 A | 2/2010 |
| JP | WO 2018230232 A1 | 4/2020 |
| KR | 20150083776 A | 7/2015 |
| KR | 20160097810 A | 8/2016 |
| KR | 20160102602 A | 8/2016 |
| TW | 201314834 A | 4/2013 |
| TW | 201421577 A | 6/2014 |
| TW | 201831723 A | 9/2018 |
| WO | WO 2018/230232 A1 | 12/2018 |

* cited by examiner

METHODS AND APPARATUS FOR CARBON COMPOUND FILM DEPOSITION

CROSS-REFERENCE TO RELATED APPLICATIONS

This application claims benefit of U.S. provisional patent application Ser. No. 62/961,363, filed Jan. 15, 2020 which is herein incorporated by reference in its entirety.

FIELD

Embodiments of the present principles generally relate to inductively coupled plasma reactor chambers for semiconductor processing.

BACKGROUND

Large-scale growth of carbon-based films such as diamond and graphene, have attracted extensive attention due to the superior mechanical and electrical properties of the films. Diamond film has various excellent properties such as extreme hardness, high thermal conductivity, good optical transparency, and high electrical resistivity, which has been used in optical coating fields for many years. Diamond film can be also used as a hard mask material in the semiconductor industry due to the diamond film's superior etch selectivity compared with other amorphous carbon films deposited by traditional plasma enhanced chemical vapor deposition (PECVD). The etch selectivity can be two or three times higher than other amorphous carbon films due to the diamond film's very high $sp^3$ carbon percentage. Graphene, due to thin thickness and high electron mobility, can be used to replace the traditional metal barrier layers for next generation semiconductor devices because the resistance of metal lines gets higher and higher as the metal lines' thickness and dimensions continues to shrink. Graphene also has high optical transparency, which can be used in flexible electronics such as, for example, in smart watch applications. However, the inventors have found that producing uniform carbon compound films is extremely difficult and time consuming, greatly reducing the wide-spread use of such films.

Thus, the inventors have provided improved methods and apparatus for depositing carbon compound films on substrates.

SUMMARY

Methods and apparatus for enhanced deposition of carbon compound films using inductively coupled plasma reactors are provided herein.

In some embodiments, an apparatus for carbon compound deposition in semiconductor processes may comprise an inductively coupled plasma (ICP) chamber with a chamber body, a lid, an interior volume, a pumping apparatus, and a gas delivery system; and a pedestal for supporting a substrate disposed within the interior volume of the ICP chamber, wherein the pedestal has a upper portion formed from aluminum nitride with an upper surface that is configured to support and heat a substrate with embedded heating elements and a lower portion with a tube-like structure formed from aluminum nitride that is configured to support the upper portion and house electrodes for supplying power to the embedded heating elements of the upper portion, and wherein the pedestal is configured to heat the substrate during deposition of a carbon compound film.

In some embodiments, the apparatus may further include wherein the pedestal is configured to heat the substrate from approximately 400 degrees Celsius to approximately 800 degrees Celsius, wherein the lid of the chamber body is flat and the ICP chamber has coaxial top coils above the lid, wherein the lid of the chamber body is domed and the ICP chamber has a top coil and a side coil, wherein the pumping apparatus is configured to maintain a pressure of approximately 2 mTorr to approximately 2 Torr, wherein the embedded heating elements are configured to operate at approximately 2 kW to approximately 4 kW, wherein the embedded heating elements have an inner heating zone and an outer heating zone which are configured to provide uniform deposition of the carbon compound film and wherein a first power supplied to the inner heating zone is less than a second power supplied to the outer heating zone, wherein the gas delivery system is configured with top and side nozzle gas injection, wherein the pedestal is configured to rotate or move vertically, and/or wherein the lower portion has a wall thickness of approximately 0.05 inches to approximately 0.10 inches such that heat loss is reduced.

In some embodiments, an apparatus for heating a substrate in an inductively coupled plasma (ICP) chamber may comprise a pedestal configured to be disposed within an interior volume of the ICP chamber and configured to heat the substrate during deposition of a carbon compound film, the pedestal configured with an upper portion formed from aluminum nitride with an upper surface that is configured to support the substrate, wherein the upper portion has embedded heating elements to heat the substrate and a lower portion with a tube-like structure formed from aluminum nitride that is configured to support the upper portion and house electrodes for supplying power to the embedded heating elements.

In some embodiments, the apparatus may further include wherein the embedded heating elements are configured to heat the substrate from approximately 400 degrees Celsius to approximately 800 degrees Celsius, wherein the embedded heating elements are configured to operate at approximately 2 kW to approximately 4 kW, wherein the embedded heating elements have an inner heating zone and an outer heating zone which are configured to provide uniform deposition of the carbon compound film, wherein a first power supplied to the inner heating zone is less than a second power supplied to the outer heating zone, wherein the pedestal is configured to rotate during deposition of the carbon compound film when positioned in the ICP chamber, wherein the pedestal is configured to move vertically when positioned in the ICP chamber, and/or wherein the lower portion has a wall thickness of approximately 0.05 inches to approximately 0.10 inches such that heat loss is reduced.

In some embodiments, a method for depositing a carbon compound film may comprise placing a substrate in an inductively coupled plasma (ICP) chamber on a pedestal formed of aluminum nitride with embedded heating elements, heating the substrate to approximately 400 degrees Celsius to approximately 800 degrees Celsius by supplying the embedded heating elements with approximately 2 kW to approximately 4 kW of power, and forming a plasma in the ICP chamber while injecting one or more gases into an interior processing volume of the ICP chamber to deposit the carbon compound film on the substrate.

In some embodiments, the method may further include rotating the pedestal during deposition of the carbon compound film to increase film uniformity and/or heating the substrate using embedded heating elements with an inner heating zone and an outer heating zone, wherein an inner heating zone temperature is less than an outer heating zone temperature to increase uniformity of film growth.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for depositing carbon compound films utilize a substrate heater in the form of a pedestal to promote film growth in an inductively coupled plasma (ICP) chamber. The substrate heater may also be rotated during deposition to increase uniformity of the deposited film. The ICP chamber deposition processing according to the present principles is suited for low temperature deposition of carbon compounds because the ICP has high radical density and is able to deposit carbon compound film on the wafer at a lower temperature. The high radical density favors high chemical reactivity, and the low temperature can minimize device damage in a wafer. ICP with chemistries such as, but not limited to, hydrocarbon and hydrogen are used to grow both diamond and graphene layers. ICP provides not only high density of hydrocarbon species for fast deposition, but also high density of hydrogen radicals, which can etch away amorphous carbon phase at lower process temperatures, yielding fast deposition of high-quality films at greatly reduced process temperatures. The methods and apparatus of the present principles combine ICP chemical vapor deposition (CVD) with innovative in-situ seed and interface controls that yield high-quality diamond and graphene films on both dielectric and metal substrates which are suitable for high-volume manufacturing.

Presently, high quality diamond and graphene films have to be deposited by CVD growth using high growth temperatures, typically 800 degrees Celsius to 1000 degrees Celsius. However, the high temperatures are not compatible with the current integration process flows used in semiconductor industry because the metal lines and low k films on device wafers cannot tolerate such high temperatures. In addition, graphene deposited by high temperature CVD also needs to be transferred out from the thick metal foils which is inconvenient and not feasible for industrial applications. The methods and apparatus of the present principles provide low temperature growth from approximately 400 degrees Celsius to approximately 800 degrees Celsius, eliminating negative effects caused by higher temperature depositions while maintaining high quality and uniform carbon compound films.

Figure 1:
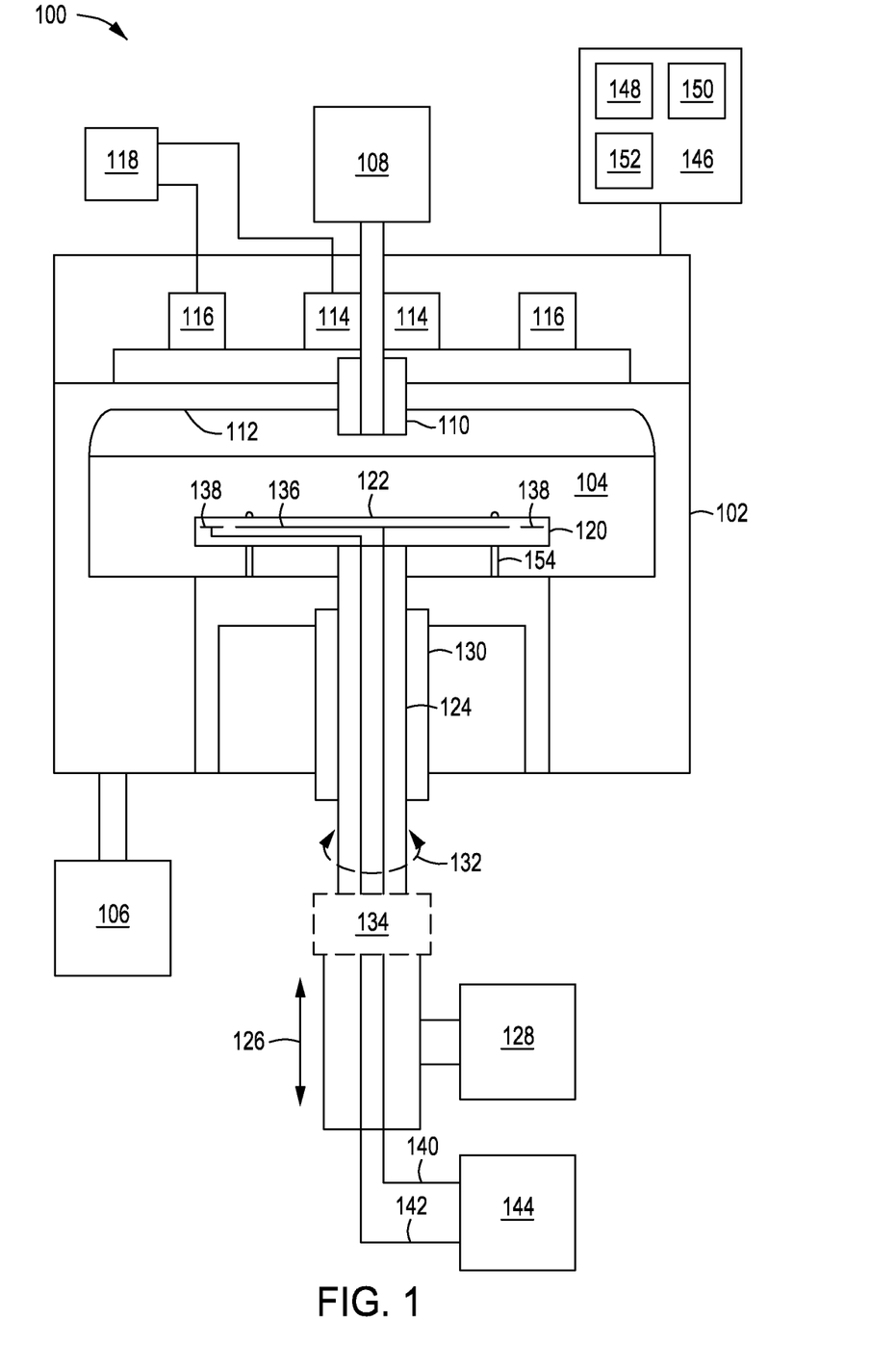
FIG. 1 depicts a schematic side view of an inductively coupled plasma chamber with a flat lid for depositing carbon compound film in accordance with some embodiments of the present principles.

Another advantage of the methods and apparatus of the present principles is that flat lid type ICP chambers and domed lid type ICP chambers are both compatible with the carbon compound film deposition processes. The methods and apparatus of the present principles also work with single wafer reactors and twin wafer reactors. FIG. 1 depicts a schematic side view of an ICP chamber 100 with a flat lid 112 for depositing carbon compound film in accordance with some embodiments. The flat lid 112 may be formed from an aluminum nitride or aluminum oxide-based material. The ICP chamber 100 includes chamber walls 102 that enclose an internal processing volume 104 where deposition occurs. The ICP chamber 100 also includes a pumping system 106 to control the pressure within the ICP chamber 100 and to expel unwanted gases before, during, or after a substrate has been processed. In some embodiments, the pressure within the internal processing volume 104 of the ICP chamber 100 may be maintained at approximately 2 mTorr to approximately 500 mTorr. In some embodiments, the pressure within the internal processing volume 104 of the ICP chamber 100 may be maintained at approximately 2 mTorr to approximately 2000 mTorr. In some embodiments, the pumping system 106 may also include a throttling gate valve to assist in maintaining the pressure within the ICP chamber 100. In some embodiments, the pumping system 106 may also include a roughing pump for fast pump down and a turbomolecular pump for higher vacuum pressures.

A gas delivery system 108 provides process gases into the internal processing volume 104 through a nozzle 110. In some embodiments, the gas delivery system 108 may include showerheads, gas rings, and/or nozzles and the like. In some embodiments, the process gases may include gases based on methane, acetylene, hydrogen, oxygen, argon, and/or helium gases and the like. Plasma is inductively coupled in the internal processing volume 104 using top coils with a dual spiral coil antenna that includes an inner coil 114 and an outer coil 116. Plasma coupling power is provided by a plasma coupling power supply 118 that may be a single unit or multiple units. The plasma coupling power supply 118 provides RF power with a frequency of approximately 2 MHz to approximately 60 MHz with approximately 3 kW to approximately 5 kW of power. The supplied RF power may be continuous or pulsed. The plasma coupling power supply 118 may also include one or more RF match networks positioned between the plasma coupling power supply 118 and the top coils for adjusting impedances.

A pedestal 120 includes an upper portion 122 and a lower portion 124. The upper portion 122 includes one or more zones of heating provided by, for example, a first embedded heater 136 and a second embedded heater 138. The one or more zones of heating are connected to one or more power supplies. In the example shown in FIG. 1, the first embedded heater 136 is connected to a heater power supply 144 via a first electrode 140. The second embedded heater 138 is connected to the heater power supply 144 via a second electrode 142. In some embodiments, the heater power supply 144 may provide approximately 2 kW to approximately 4 kW to each of the first embedded heater 136 and to the second embedded heater 138. In some embodiments, more than one heater power supply may be used. In some embodiments, the upper portion 122 may also allow lift pins 154 to pass through the upper portion to allow substrates to be lifted onto and off the pedestal 120 (see, e.g., FIG. 3). The pedestal 120 has vertical motion 126 provided by a lifting assembly 128. A bellows 130 allows the vertical motion 126 to occur without breaking the seal of the internal processing volume 104. In some embodiments, the pedestal 120 may also have an optional rotational assembly 134 that provides rotational motion 132 to the pedestal 120. The rotational motion 132 assists in providing a more uniform film deposition during processing of the substrate.

The ICP chamber 100 may also include a controller 146. The controller 146 controls the operation of the ICP chamber 100 using a direct control or alternatively, by controlling the computers (or controllers) associated with the ICP chamber 100. In operation, the controller 146 enables data collection and feedback to optimize performance of the ICP chamber 100. The controller 146 generally includes a Central Processing Unit (CPU) 148, a memory 150, and a support circuit 152. The CPU 148 may be any form of a general-purpose computer processor that can be used in an industrial setting. The support circuit 152 is conventionally coupled to the CPU 148 and may comprise a cache, clock circuits, input/output subsystems, power supplies, and the like. Software routines, such as a method as described above may be stored in the memory 150 and, when executed by the CPU 148, transform the CPU 148 into a specific purpose computer (controller 146). The software routines may also be stored and/or executed by a second controller (not shown) that is located remotely from the ICP chamber 100.

The memory 150 is in the form of computer-readable storage media that contains instructions, when executed by the CPU 148, to facilitate the operation of the semiconductor processes and equipment. The instructions in the memory 150 are in the form of a program product such as a program that implements the apparatus of the present principles. The program code may conform to any one of a number of different programming languages. In one example, the disclosure may be implemented as a program product stored on a computer-readable storage media for use with a computer system. The program(s) of the program product define functions of the aspects. Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the substrate heating system described herein, are aspects of the present principles.

Figure 2:
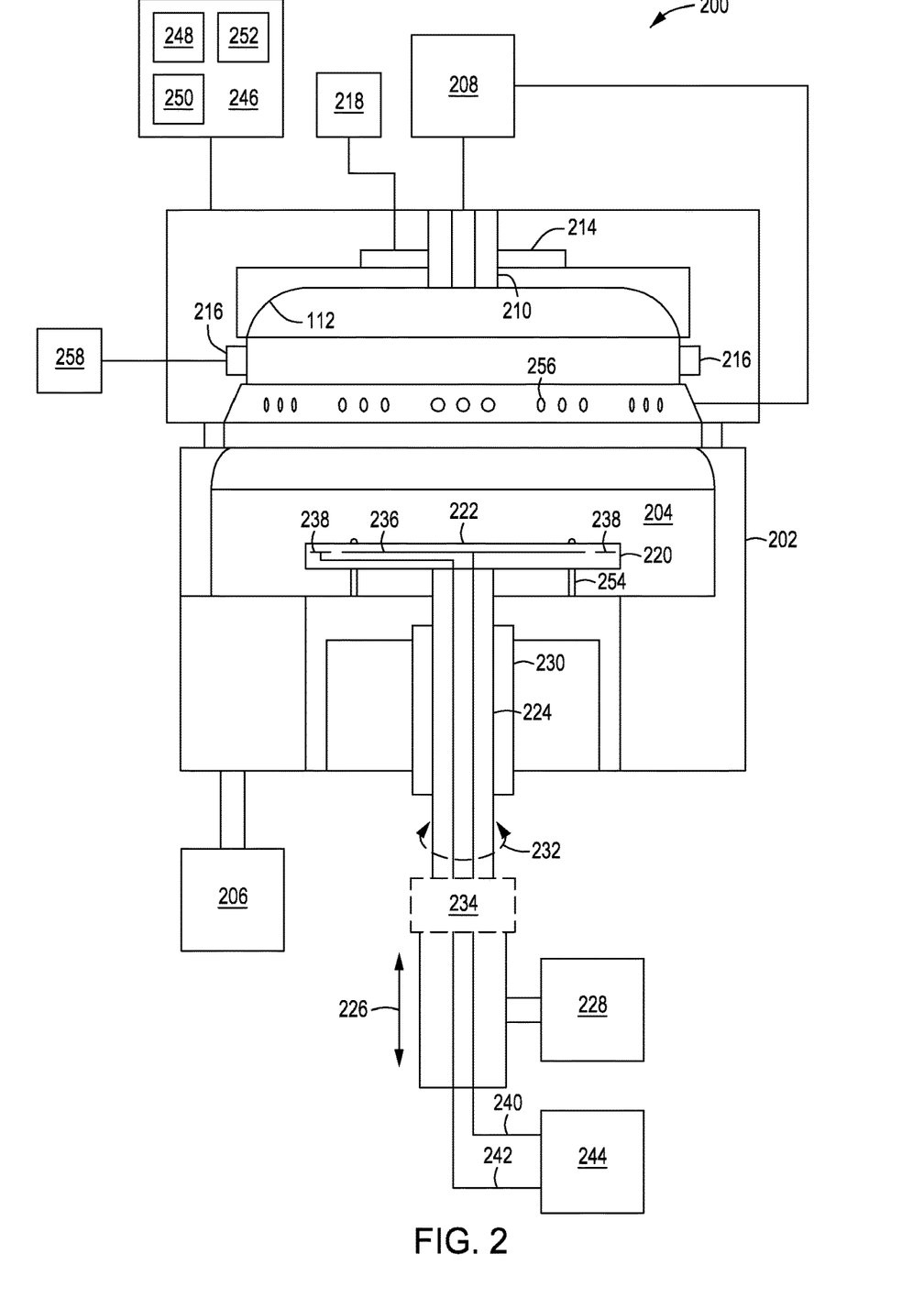
FIG. 2 depicts a schematic side view of an inductively coupled plasma chamber with a domed lid for depositing carbon compound film in accordance with some embodiments of the present principles.

FIG. 2 depicts a schematic side view of an ICP chamber 200 with a domed lid 212 for depositing carbon compound film in accordance with some embodiments. The domed lid 212 may be formed from an aluminum nitride or aluminum oxide-based material. The ICP chamber 200 includes chamber walls 202 that enclose an internal processing volume 204 where deposition occurs. The ICP chamber 200 also includes a pumping system 206 to control the pressure within the ICP chamber 200 and to expel unwanted gases before, during, or after a substrate has been processed. In some embodiments, the pressure within the internal processing volume 204 of the ICP chamber 200 may be maintained from approximately 2 mTorr to approximately 500 mTorr. In some embodiments, the pressure within the internal processing volume 204 of the ICP chamber 200 may be maintained from approximately 2 mTorr to approximately 2000 mTorr. In some embodiments, the pumping system 206 may also include a throttling gate valve to assist in maintaining the pressure within the ICP chamber 200. In some embodiments, the pumping system 206 may also include a roughing pump for fast pump down and a turbomolecular pump for high vacuum pressures.

A gas delivery system 208 provides process gases into the internal processing volume 204 through a top nozzle 210 and side nozzles 256. The top nozzle 210 and the side nozzles 256 can be adjusted to facilitate in providing a uniform deposition on a substrate. The nozzles can be formed from an aluminum, aluminum oxide, or aluminum nitride material. In some embodiments, the gas delivery system 208 may include showerheads, gas rings, and/or nozzles and the like. In some embodiments, the process gases may include gases based on methane, acetylene, hydrogen, oxygen, argon, and/or helium gases and the like. Plasma is inductively coupled using a top coil 214 and a side coil 216. In some embodiments, plasma coupling power may be provided by a top coil plasma coupling power supply 218 and a side coil plasma coupling power supply 258. In some embodiments, the top coil 214 and the side coil 216 may be supplied power by a common plasma coupling power supply (not shown). The top coil plasma coupling power supply 218 and the side coil plasma coupling power supply 258 provide RF power with a frequency of approximately 2 MHz to approximately 60 MHz with approximately 3 kW to approximately 20 kW of power. The supplied RF power may be continuous or pulsed. The top coil plasma coupling power supply 218 and the side coil plasma coupling power supply 258 may also include RF match networks positioned between the power supplies and the coils, respectively, for adjusting impedances.

A pedestal 220 includes an upper portion 222 and a lower portion 224. The upper portion 222 includes one or more zones of heating provided by, for example, a first embedded heater 236 and a second embedded heater 238. The one or more zones of heating are connected to one or more power supplies. In the example shown in FIG. 2, the first embedded heater 236 is connected to a heater power supply 244 via a first electrode 240. The second embedded heater 238 is connected to the heater power supply 244 via a second electrode 242. In some embodiments, the heater power supply 244 may provide approximately 2 kW to approximately 4 kW to each of the first embedded heater 236 and to the second embedded heater 238. In some embodiments, the upper portion 222 may also allow lift pins 254 to pass through the upper portion to allow substrates to be lifted onto and off the pedestal 220 (see, e.g., FIG. 3). The pedestal 220 has vertical motion 226 provided by a lifting assembly 228. A bellows 230 allows the vertical motion 226 to occur without breaking the seal of the internal processing volume 204. In some embodiments, the pedestal 220 may also have an optional rotational assembly 234 that provides rotational motion 232 to the pedestal 220. The rotational motion 232 assists in providing a more uniform film deposition during processing of the substrate.

The ICP chamber 200 may also include a controller 246. The controller 246 controls the operation of the ICP chamber 200 using a direct control or alternatively, by controlling the computers (or controllers) associated with the ICP chamber 200. In operation, the controller 246 enables data collection and feedback to optimize performance of the ICP chamber 200. The controller 246 generally includes a Central Processing Unit (CPU) 248, a memory 250, and a support circuit 252. The CPU 248 may be any form of a general-purpose computer processor that can be used in an industrial setting. The support circuit 252 is conventionally coupled to the CPU 248 and may comprise a cache, clock circuits, input/output subsystems, power supplies, and the like. Software routines, such as a method as described above may be stored in the memory 250 and, when executed by the CPU 248, transform the CPU 248 into a specific purpose computer (controller 246). The software routines may also be stored and/or executed by a second controller (not shown) that is located remotely from the ICP chamber 200.

The memory 250 is in the form of computer-readable storage media that contains instructions, when executed by the CPU 248, to facilitate the operation of the semiconductor processes and equipment. The instructions in the memory 250 are in the form of a program product such as a program that implements the apparatus of the present principles. The program code may conform to any one of a number of different programming languages. In one example, the disclosure may be implemented as a program product stored on a computer-readable storage media for use with a computer system. The program(s) of the program product define functions of the aspects. Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the substrate heating system described herein, are aspects of the present principles.

Figure 3:
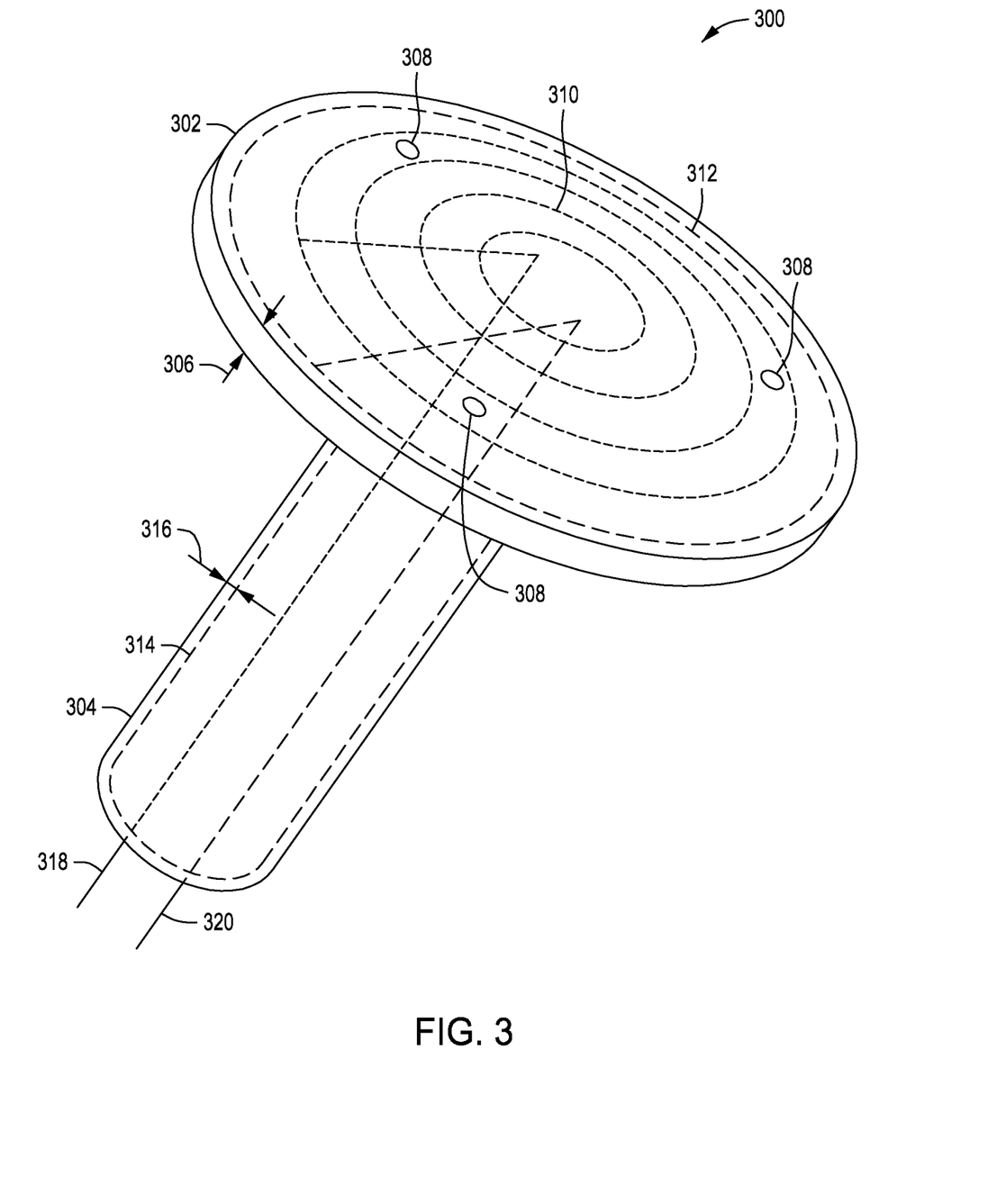
FIG. 3 depicts an isometric view of a pedestal with dual zone heating for an inductively coupled plasma chamber in accordance with some embodiments of the present principles.

FIG. 3 depicts an isometric view of a pedestal 300 with dual zone heating for an inductively coupled plasma chamber in accordance with some embodiments. The pedestal 300 includes an upper portion 302 that is configured to support a substrate and to heat the substrate. In some embodiments, the upper portion 302 includes one or more through passages 308 to allow lift pins (not shown, see FIGS. 1 and 2) to pass through the upper portion 302 in order to lift the substrate from the upper portion 302 as the pedestal 300 moves vertically downward. In some embodiments, the upper portion 302 includes one or more heating zones. In the example of FIG. 3, a first heating zone is defined by a first set of embedded heating elements 310 positioned centrally in the upper portion 302. The first set of embedded heating elements 310 are in electrical contact with a first electrode 318 which is configured to be connected to a heating power supply (not shown, see FIGS. 1 and 2). A second heating zone is defined by a second set of embedded heating elements 312 positioned in proximity of a periphery of the upper portion 302. The second set of embedded heating elements 312 are in electrical contact with a second electrode 320 which is configured to be connected to a heating power supply (not shown, see FIGS. 1 and 2). In some embodiments, during film deposition, the second heating zone may have approximately 75% to approximately 125% higher power applied compared to the first heating zone to compensate for edge cooling of a substrate occurring within the ICP chamber. In some embodiments, the second heating zone has a higher temperature than the first heating zone.

The upper portion 302 is formed from an aluminum nitride material and, in some embodiments, has a thickness 306 of approximately 0.500 inches to approximately 0.750 inches. The aluminum nitride material has a high thermal conductivity and when used with dual heating zones, allows the upper portion 302 to heat a substrate to a uniform temperature which allows increased and more uniform growth of film on the substrate surface. The aluminum nitride material is also resistant to the chemicals used during the deposition process. The pedestal 300 has a lower portion 304 with a tube-like structure formed from aluminum nitride. The lower portion 304 has walls 314 with a thickness 316 of approximately 0.05 inches to approximately 0.10 inches. The inventors have found that if the thickness 316 of the walls 314 is kept to a minimum, heat loss from the pedestal 300 via the lower portion 304 will be dramatically reduced. The tube-like structure of the lower portion 304 permits the first electrode and the second electrode to be routed within the lower portion 304 to the upper portion 302, connecting with the first set of embedded heating elements 310 and the second set of embedded heating elements 312, respectively.

Figure 4:
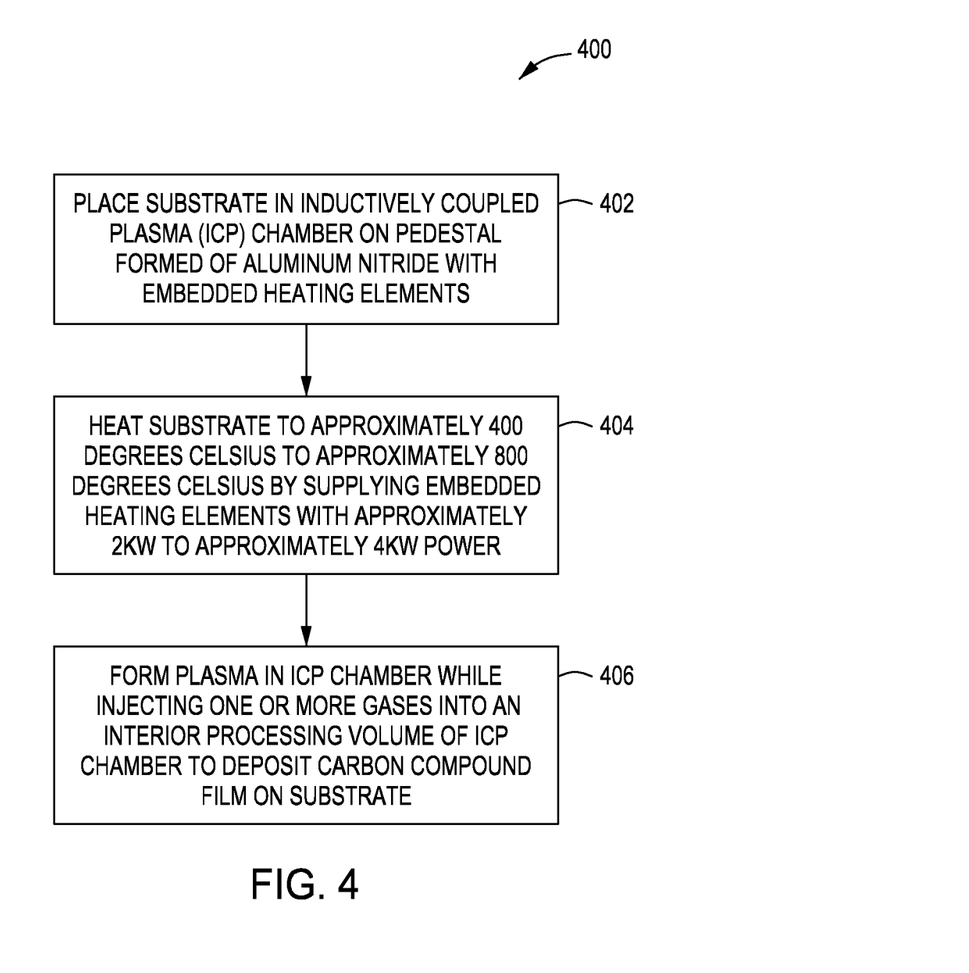
FIG. 4 is a method of depositing a carbon compound film with an inductively coupled plasma chamber in accordance with some embodiments of the present principles.

FIG. 4 is a method 400 of depositing a carbon compound film in an ICP chamber in accordance with some embodiments. In block 402, a substrate is place in the ICP chamber on a pedestal formed of aluminum nitride with embedded heating elements. In some embodiments, the embedded heating elements may form one or more heating zones and may be configured to provide uniform heating of the substrate even in the presence of edge cooling effects caused by, for example, gas flow in the internal processing volume of the ICP chamber. The one or more heating zones may include an inner heating zone centrally positioned within an upper portion of the pedestal and an outer heating zone positioned in proximity of the periphery of the upper portion of the pedestal. In some embodiments, the outer heating zone may be heated with a higher power than the inner heating zone due to influences internal to the ICP chamber that may cool the periphery of a substrate. In block 404, the substrate is heated by the embedded heating elements to approximately 400 degrees Celsius to approximately 800 degrees Celsius by supplying the embedded heating elements with approximately 2 kW to approximately 4 kW of power. The supplied power may vary based on different heating zones and/or internal temperatures of the ICP chamber. In some embodiments, the substrate is heated by the embedded heating elements to approximately 400 degrees Celsius to approximately 750 degrees Celsius. In some embodiments, the substrate is heated by the embedded heating elements to approximately 400 degrees Celsius to approximately 700 degrees Celsius.

In block 406, plasma is inductively coupled in the ICP chamber while injecting one or more gases into the interior processing volume of the ICP chamber to deposit a carbon compound film on the substrate. In some embodiments, the one or more gases may be based on methane, acetylene, hydrogen, oxygen, argon, and/or helium gases and the like. In some embodiments, the plasma coupling power may be an RF continuous and/or pulsing power source operating from approximately 2 MHz to approximately 60 MHz with approximately 3 kW to approximately 20 kW of power. In some embodiments using dual top coils, the plasma coupling power may be an RF source operating at approximately 13.56 MHz with approximately 3 kW of power. In some embodiments using top and side coils, the top and side coils may be powered by one or more RF sources operating at approximately 2 MHz with approximately 10 kW of power provided to the top coil and to the side coil. In some embodiments, the ICP chamber may be operated with a pressure of approximately 2 mTorr to approximately 500 mTorr during carbon compound film deposition. In some embodiments, the ICP chamber may be operated with a pressure of approximately 2 mTorr to approximately 2000 mTorr during carbon compound film deposition. The heating of the substrate promotes increased carbon compound film growth on the substrate. The deposition process may occur for approximately 60 seconds to approximately 30 minutes. In some embodiments, the pedestal may be rotated during carbon compound film deposition processes such that a more uniform deposition occurs on the substrate.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for forming a film on a substrate, comprising:
   an inductively coupled plasma (ICP) chamber with a chamber body and an interior volume within the chamber body;
   a pedestal disposed within the interior volume of the chamber body, the pedestal including:
      an upper portion formed from aluminum nitride with an upper surface configured to support the substrate, wherein the upper portion has embedded heating elements to heat the substrate; and
      a lower portion with a tube-like structure formed from aluminum nitride configured to support the upper portion and house electrodes for supplying power to the embedded heating elements; and
   a controller in communication with, at least, the ICP chamber and the pedestal and configured to deposit a graphene film or a diamond film on both metal and dielectric materials.

2. The apparatus of claim 1, wherein the controller is configured to heat the substrate from approximately 400 degrees Celsius to approximately 800 degrees Celsius.

3. The apparatus of claim 1, wherein the embedded heating elements are configured to operate at approximately 2 kW to approximately 4 kW.

4. The apparatus of claim 1, wherein the embedded heating elements have an inner heating zone and an outer heating zone and wherein the controller is configured to provide uniform deposition of the graphene film or the diamond film by the controller altering temperatures of the inner heating zone and the outer heating zone to compensate for edge cooling of the substrate during deposition.

5. The apparatus of claim 4, wherein a first power supplied to the inner heating zone is less than a second power supplied to the outer heating zone.

6. The apparatus of claim 1, wherein the controller is configured to rotate the pedestal during deposition of the graphene film or the diamond film.

7. The apparatus of claim 1, wherein the controller is configured to move the pedestal vertically.

8. The apparatus of claim 1, wherein the lower portion has a wall thickness of approximately 0.05 inches to approximately 0.10 inches such that heat loss is reduced.

9. An apparatus for film deposition in semiconductor processes, comprising:
   an inductively coupled plasma (ICP) chamber with a chamber body, a lid, an interior volume, a pumping apparatus, and a gas delivery system;
   the lid formed of an aluminum nitride or aluminum oxide-based material;
   at least one top coil positioned on top of the lid and in electrical communication with a plasma power supply operating at a frequency of approximately 2 MHz to approximately 60 MHz at approximately 3 kW to approximately 20 KW of power;
   a pedestal for supporting a substrate disposed within the interior volume of the ICP chamber, wherein the pedestal has a upper portion formed from aluminum nitride with an upper surface that is configured to support and heat the substrate with embedded heating elements and a lower portion with a tube-like structure formed from aluminum nitride that is configured to support the upper portion and house electrodes for supplying power to the embedded heating elements of the upper portion, and wherein the pedestal is configured to heat the substrate during deposition of a film; and
   a controller configured to heat the pedestal to approximately 400 degrees Celsius to approximately 800 degrees Celsius, form plasma in the ICP chamber, inject one or more gases into the interior volume of the ICP chamber, and deposit a graphene film or a diamond film on both metal and dielectric materials.

10. The apparatus of claim 9, wherein the upper portion has a thickness of approximately 0.5 inches to approximately 0.75 inches.

11. The apparatus of claim 9, wherein the lid of the chamber body is flat and the ICP chamber has coaxial top coils above the lid.

12. The apparatus of claim 9, wherein the lid of the chamber body is domed and the ICP chamber has a side coil, wherein the at least one top coil and the side coil are electrically connected to the plasma power supply, and wherein the controller is configured to operate the plasma power supply at a frequency of approximately 2 MHz and at approximately 10 kW of power during deposition of the graphene film or the diamond film.

13. The apparatus of claim 9, wherein the controller maintains a pressure of approximately 2 mTorr to approximately 2 Torr in the interior volume during deposition.

14. The apparatus of claim 9, wherein the upper portion includes one or more through passages.

15. The apparatus of claim 9, wherein the embedded heating elements have an inner heating zone and an outer heating zone and wherein the controller is configured to provide uniform deposition of the graphene film or the diamond film by altering a first power supplied to the inner heating zone to be less than a second power supplied to the outer heating zone to compensate for edge cooling of the substrate during deposition.

16. The apparatus of claim 9, wherein the gas delivery system is configured with top and side nozzle gas injection.

17. The apparatus of claim 9, wherein the pedestal is configured to rotate or move vertically.

18. The apparatus of claim 9, wherein the lower portion has a wall thickness of approximately 0.05 inches to approximately 0.10 inches.

19. A method for depositing a film, comprising:
   placing a substrate in an inductively coupled plasma (ICP) chamber on a pedestal, wherein the ICP chamber has a chamber body and an interior volume within the chamber body with the pedestal disposed therein;
   the pedestal including:
      an upper portion formed from aluminum nitride with an upper surface configured to support the substrate, wherein the upper portion has embedded heating elements to heat the substrate; and
      a lower portion with a tube-like structure formed from aluminum nitride configured to support the upper portion and house electrodes for supplying power to the embedded heating elements;
   heating the substrate to approximately 400 degrees Celsius to approximately 800 degrees Celsius using a controller in communication with, at least, the ICP chamber and the pedestal which is configured to deposit a graphene film or a diamond film on both metal and dielectric materials; and
   forming a plasma in the ICP chamber while injecting one or more gases into an interior processing volume of the ICP chamber to deposit the graphene film or the diamond film on both metal and dielectric materials on the substrate using the controller, wherein the plasma is formed using a plasma power supply operating at a frequency of approximately 2 MHz to approximately 60 MHz and with approximately 3 kW to approximately 20 kW of power.

20. The method of claim 19, further comprising:
   rotating the pedestal during deposition of the graphene film or the diamond film to increase film uniformity; or
   heating the substrate using embedded heating elements with an inner heating zone and an outer heating zone, wherein an inner heating zone temperature is less than an outer heating zone temperature to increase uniformity of film growth.

\* \* \* \* \*